(12) United States Patent
Li et al.

(10) Patent No.: US 10,285,448 B2
(45) Date of Patent: May 14, 2019

(54) AEROSOL GENERATING DEVICE

(71) Applicant: Shenzhen First Union Technology Co., Ltd., Shenzhen, Guangdong Province (CN)

(72) Inventors: Yuqin Li, Shenzhen (CN); Hongbin Chen, Shenzhen (CN); Yonghai Li, Shenzhen (CN); Zhongli Xu, Shenzhen (CN)

(73) Assignee: SHENZHEN FIRST UNION TECHNOLOGY CO., LTD., Shenzhen, Guangdong Province (CN)

( * ) Notice: Subject to any disclaimer, the term of this patent is extended or adjusted under 35 U.S.C. 154(b) by 63 days.

(21) Appl. No.: 15/693,449

(22) Filed: Aug. 31, 2017

(65) Prior Publication Data

US 2017/0360102 A1  Dec. 21, 2017

(30) Foreign Application Priority Data

Sep. 6, 2016  (CN) .................... 2016 2 1039236 U

(51) Int. Cl.
| | |
|---|---|
| A24F 13/00 | (2006.01) |
| A24F 47/00 | (2006.01) |
| H05B 6/04 | (2006.01) |
| H05B 6/10 | (2006.01) |
| H05B 6/44 | (2006.01) |
| H03B 5/08 | (2006.01) |

(52) U.S. Cl.
CPC ............ *A24F 47/008* (2013.01); *H05B 6/04* (2013.01); *H05B 6/105* (2013.01); *H05B 6/44* (2013.01); *H03B 5/08* (2013.01)

(58) Field of Classification Search
USPC .................................................. 131/329, 328
See application file for complete search history.

(56) References Cited

U.S. PATENT DOCUMENTS

| | | | |
|---|---|---|---|
| 10,143,239 B2 * | 12/2018 | Gavrielov | ............. A24F 47/008 |
| 2016/0174610 A1 * | 6/2016 | Kuczaj | ................. A24F 47/008 |
| | | | 131/328 |
| 2018/0310623 A1 * | 11/2018 | Batista | .................. A24F 47/008 |

* cited by examiner

*Primary Examiner* — Phuong K Dinh
(74) *Attorney, Agent, or Firm* — Cheng-Ju Chiang

(57) ABSTRACT

The present disclosure relates to an aerosol generating device for heating solid tobacco substance. The aerosol generating device includes a housing having a first air inlet, a power supply, a cup body arranged in the housing, a coil module, and a heating element. The power supply is configured for supplying an alternating current power supply. The cup body is configured for receiving the solid tobacco substance, and defines a second air inlet. The coil module is arranged between the housing and the cup body. Two opposite ends of the coil module are connected to the alternating current power supply, such that the coil module generates a high frequency alternating magnetic field. The heating element is arranged at a center of the cup body. The heating element is configured for generating an eddy current and heat in response to the alternating magnetic field, thus heating the solid tobacco substance.

9 Claims, 4 Drawing Sheets

… (1/2)

AEROSOL GENERATING DEVICE

TECHNICAL FIELD

The present invention relates to electronic cigarettes, and particularly to an aerosol generating device.

BACKGROUND ART

In a typical aerosol generating device, a nickel chromium heating body is used to heat. However, a thermal efficiency of the aerosol generating device is a bit low.

What is needed, therefore, is an aerosol generating device, which can overcome the above shortcomings.

SUMMARY

The present disclosure relates to an aerosol generating device for heating solid tobacco substance. The aerosol generating device includes a housing having a first air inlet, a power supply, a cup body arranged in the housing, a coil module, and a heating element. The power supply is configured for supplying an alternating current power supply. The cup body is configured for receiving the solid tobacco substance, and defines a second air inlet. The coil module is arranged between the housing and the cup body. Two opposite ends of the coil module are connected to the alternating current power supply, such that the coil module generates a high frequency alternating magnetic field. The heating element is arranged at a center of the cup body. The heating element is configured for generating an eddy current and heat in response to the alternating magnetic field, thus heating the solid tobacco substance.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
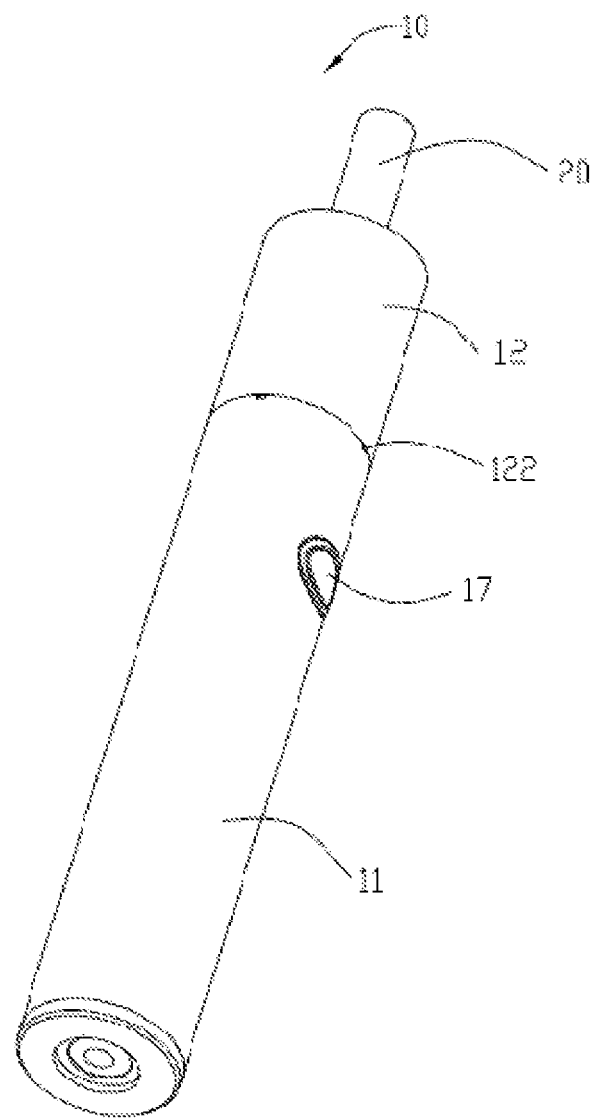
FIG. 1 is a perspective view of an aerosol generating device including a power supply according to an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Several definitions that apply throughout this disclosure will now be presented.

The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 2:
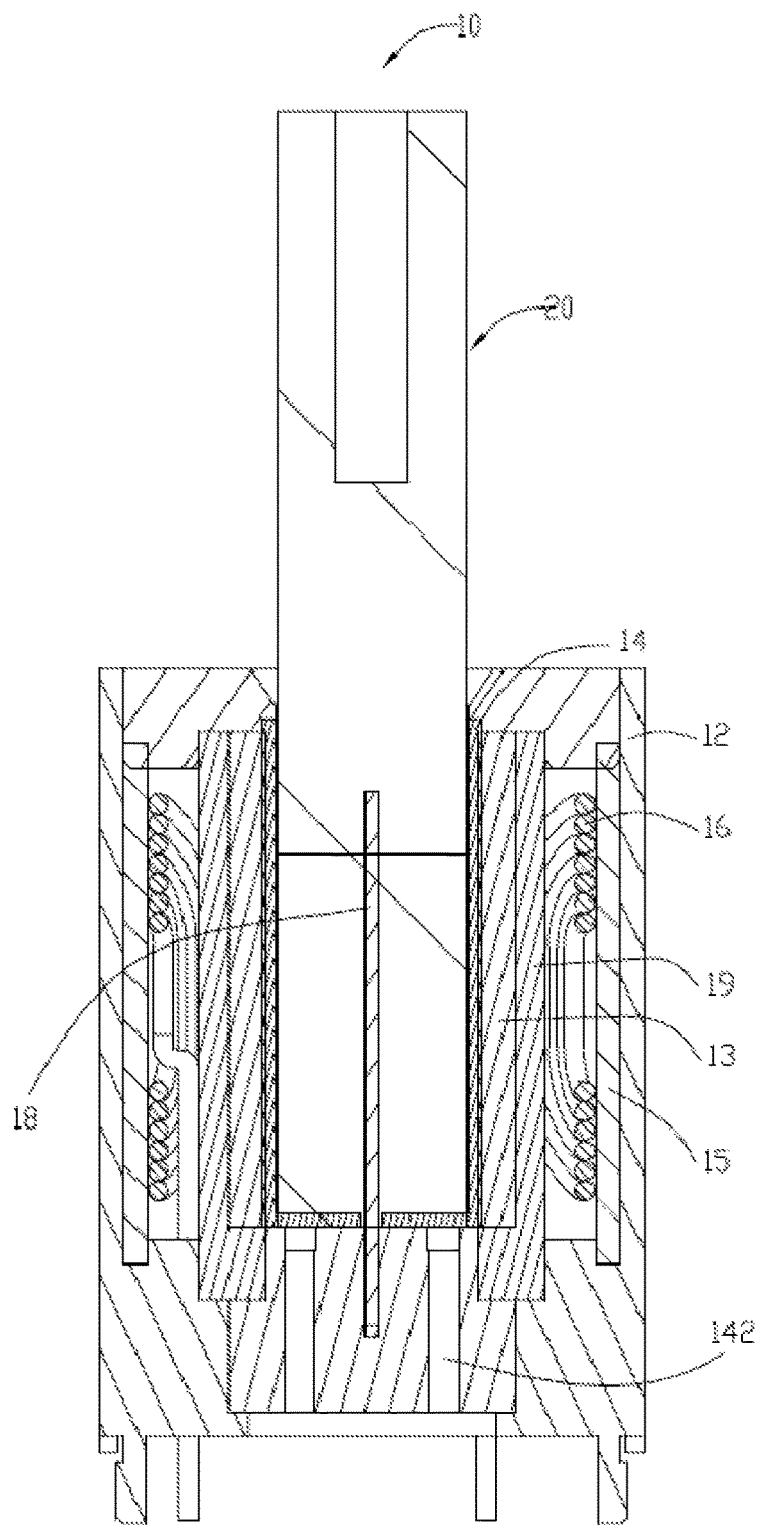
FIG. 2 is a longitudinal section view of the aerosol generating device of FIG. 1, omitting the power supply.

Referring to FIGS. 1-2, an aerosol generating device 10 is shown. The aerosol generating device 10 includes a housing 12 with a first air inlet 122, a cup body 14 arranged in the housing 12, a coil module 16, a heating element 18, and a power supply 11. The coil module 16 is arranged between the housing 12 and the cup body 14. The heating element 18 is arranged in a center of the cup body 14.

Figure 3:
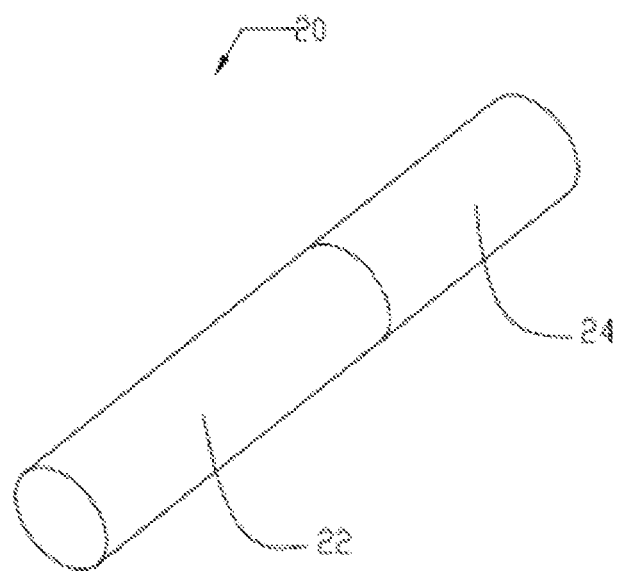
FIG. 3 is a perspective view of a cigarette for the aerosol generating device.

The aerosol generating device 10 is configured (i.e., structured and arranged) for heating solid tobacco substance (e.g., tobacco leaf, cabo, pipe tobacco) to form aerosol for users. In the present embodiment, the aerosol generating device 10 is configured for heating a cigarette 20, as seen in FIG. 3. The cigarette 20 includes a mouthpiece part 22 and a tobacco part 24.

The cup body 14 is substantially cylindrical, and is configured for receiving solid tobacco substance. The cup body 14 defines a second air inlet 142 at an end. The second air inlet 142 is in communication with the first air inlet 122. The cup body 14 may be made of plastic. Two opposite ends of the coil module 16 are connected to an alternate current power supply (described in detail later). The coil module 16 is configured for generating a high frequency alternating magnetic field. The heating element 18 is configured for generating an eddy current and heat in the high frequency alternating magnetic field, thereby heating the cigarette 20. The power supply 11 is configured for supplying the coil module 16 with alternate current power.

Figure 4:
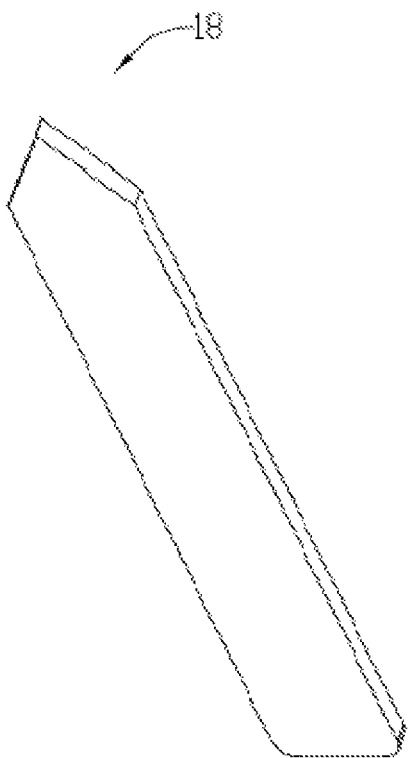
FIG. 4 is a perspective view of a heating element of the aerosol generating device of FIG. 1.

Referring to FIG. 4, in the present embodiment, the heating element 18 is a plate with a pointed end, so that the heating element 18 can insert the cigarette 20 easily. It is to be understood that, in other embodiments, the heating element 18 may be a cylinder with a tapered end. The heating element 18 may be made of metal, e.g., iron, or stainless steel.

Figure 5:
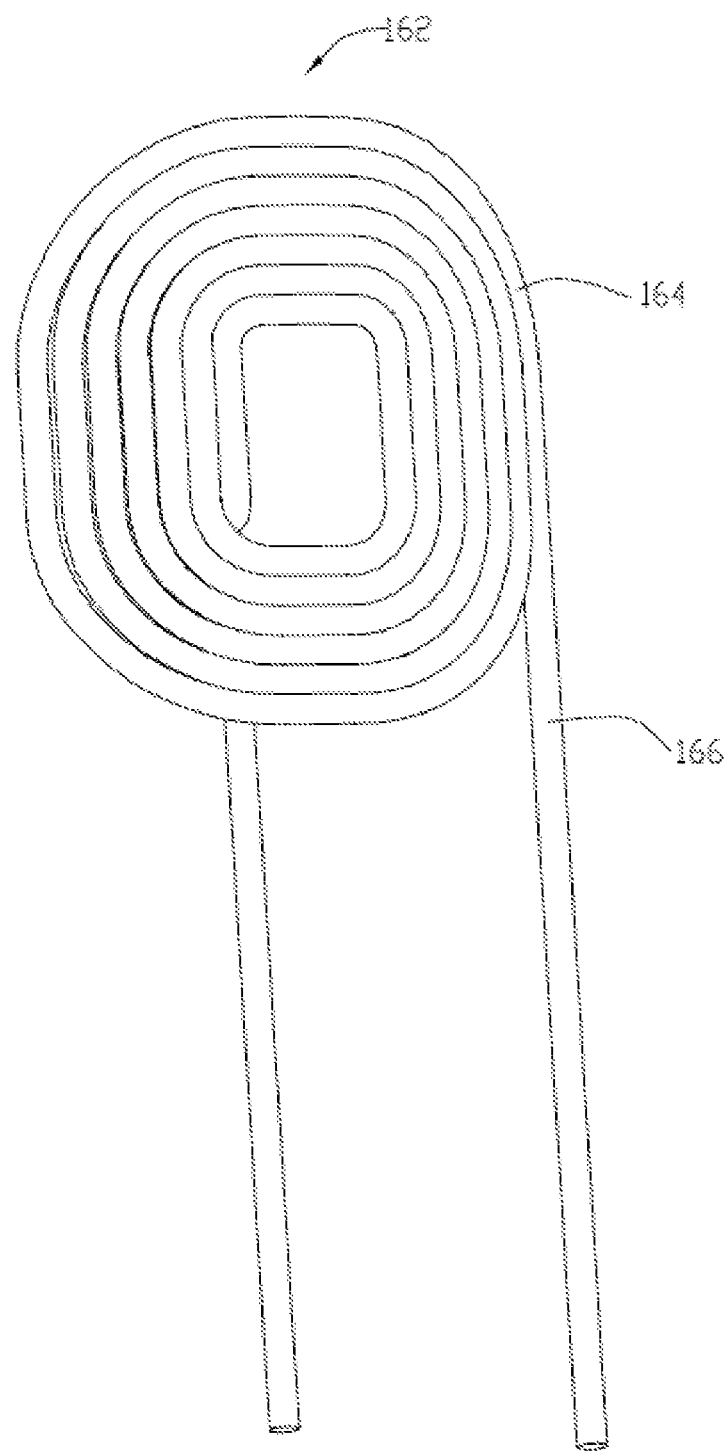
FIG. 5 is a perspective view of a coil of the aerosol generating device of FIG. 1.

Referring to FIG. 5, in the present embodiment, the coil module 16 includes two opposite coils 162. Each coil 162 includes a main body 164 and a lead part 166. The two coils 162 cooperatively wrap around an outer surface of the cup body 14. When powered, the two coils 162 generate an alternating magnetic field. An axial direction of each coil 162 is substantially perpendicular to an axial direction of the cup body 14. That is, a magnetic field line in a central part of the alternating magnetic field is substantially perpendicular to an axial direction of the cup body 14.

The power supply 11 includes a battery and an LC oscillating circuit. The battery is electrically connected to the LC oscillating circuit, and configured for providing working power. The LC oscillating circuit is configured for generating alternating current.

Further, the aerosol generating device 10 further includes a thermal insulation layer 13 arranged between the cup body 14 and the housing 12. The thermal insulation layer 13 may be made of asbestos or aerogel blanket. The thermal insulation layer 13 keeps a surface temperature of the housing 12 below 40 Celsius degrees, thus preventing the user from being burnt.

Further, the aerosol generating device 10 includes a radiation protection layer 15 arranged between the coil module 16 and the housing 12. The radiation protection layer 15 is configured for protecting the user from radiation. The radiation protection layer 15 may be made of ferrite.

Even further, the aerosol generating device 10 includes a holder 19 configured for supporting the thermal insulation layer 13. The holder 19 is arranged between the coil module 16 and the thermal insulation layer 13.

Still further, the aerosol generating device 10 includes a switch 17 arranged on the housing 12.

In use, the switch 17 is pressed, and the aerosol generating device 10 starts working. The power supply 11 provides the coil module 16 with alternating current, and the coil module 16 generates an alternating magnetic field. The eddy current is produced in the heating element 18, and the heating element 18 heats up the cigarette 20 to form aerosol. Accordingly, the user can inhale the aerosol via the mouthpiece part 22. When the taste of the aerosol becomes thin, the cigarette 20 is pulled out, and is replaced by a new one.

It is to be understood that in other embodiments, the aerosol generating device 10 may include only one coil, and the coil is wrapped around the around the outer surface of the cup body 14 in a manner similar to the above embodiment (see FIG. 2).

In the present embodiment, the heating element 18 heats the cigarette directly. Therefore, a thermal efficiency of the aerosol generating device is high.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. An aerosol generating device for heating solid tobacco substance, comprising:
    a housing having a first air inlet;
    a power supply configured for supplying an alternating current power supply;
    a cup body arranged in the housing, the cup body being configured for receiving the solid tobacco substance, the cup body defining a second air inlet;
    a coil module arranged between the housing and the cup body, two opposite ends of the coil module being connected to the alternating current power supply, such that the coil module generates a high frequency alternating magnetic field; and
    a heating element arranged at a center of the cup body, the heating element being configured for generating an eddy current and heat in response to the alternating magnetic field, thus heating the solid tobacco substance.

2. The aerosol generating device according to claim 1, wherein the heating element comprises a plate with a pointed end or a tapered cylinder.

3. The aerosol generating device according to claim 1, wherein the coil module comprises two opposite coils, and an axial direction of each coil is substantially perpendicular to an axial direction of the cup body.

4. The aerosol generating device according to claim 1, further comprising a thermal insulation layer arranged between the cup body and the housing.

5. The aerosol generating device according to claim 4, wherein the thermal insulation layer is made of asbestos or aerogel blanket.

6. The aerosol generating device according to claim 1, further comprising a radiation protection layer.

7. The aerosol generating device according to claim 6, wherein the radiation protection layer is made of ferrite.

8. The aerosol generating device according to claim 1, wherein the cup body is made of plastic.

9. The aerosol generating device according to claim 1, wherein the power supply comprises a battery and an LC oscillating circuit, the LC oscillating circuit is electrically connected to the battery, and the LC oscillating circuit is configured for generating alternating current.

* * * * *